United States Patent
Kudo et al.

(10) Patent No.: US 7,085,116 B2
(45) Date of Patent: Aug. 1, 2006

(54) OVERLOAD CURRENT PROTECTION DEVICE USING MAGNETIC IMPEDANCE ELEMENT

(75) Inventors: Takahiro Kudo, Kanagawa (JP); Yujiro Kitaide, Kanagawa (JP); Kimitada Ishikawa, Saitama (JP)

(73) Assignee: Fuji Electric Co., Ltd., Kawasaki (JP)

(*) Notice: Subject to any disclaimer, the term of this patent is extended or adjusted under 35 U.S.C. 154(b) by 116 days.

(21) Appl. No.: 10/468,045

(22) PCT Filed: Feb. 14, 2002

(86) PCT No.: PCT/JP02/01238

§ 371 (c)(1),
(2), (4) Date: Dec. 22, 2003

(87) PCT Pub. No.: WO02/065609

PCT Pub. Date: Aug. 22, 2002

(65) Prior Publication Data
US 2004/0085075 A1    May 6, 2004

(30) Foreign Application Priority Data
Feb. 16, 2001 (JP) ............................ 2001-040266

(51) Int. Cl.
*H02H 3/08* (2006.01)
*H02H 9/02* (2006.01)

(52) U.S. Cl. .................... 361/93.6; 361/56; 361/111

(58) Field of Classification Search ............ 361/56, 361/93.6, 111
See application file for complete search history.

(56) References Cited

U.S. PATENT DOCUMENTS

| | | | | |
|---|---|---|---|---|
| 4,823,075 A | * | 4/1989 | Alley | ............. 324/117 H |
| 5,448,442 A | * | 9/1995 | Farag | ................. 361/24 |
| 5,834,940 A | | 11/1998 | Brooks et al. | |
| 5,994,899 A | | 11/1999 | Mohri | |

FOREIGN PATENT DOCUMENTS

EP    0 773449    5/1997

(Continued)

OTHER PUBLICATIONS

Inada et al; "Quick Response Large Current Sensor Using Amorphous MI element Resonant Multivibrator"; *IEEE Transactions on Magnetics*; Nov. 1994; vol. 30, No. 6, pp. 4623-4625.

(Continued)

Primary Examiner—Phuong T. Vu
Assistant Examiner—Dharti H. Patel
(74) Attorney, Agent, or Firm—Greer, Burns & Crain, Ltd

(57) ABSTRACT

In an overload current protection device for cutting off power from a power supply to a load (3) such as a motor by means of a contactor (switch) (2) at overloading, an MI element having a magnetic impedance (MI) effect as current detectors (4a, 4b, and 4c) is installed at a position capable of detecting a current flowing through the secondary winding of power supply transformers (5a, 5b, and 5c) that generate a control power supply to thereby reduce costs without using a constant voltage power supply and expand a current detection range by eliminating magnetic saturation due to a core, a problem with a conventional current transformer, thereby providing at low costs a high-precision overload current protection device having a wide current detection range.

12 Claims, 5 Drawing Sheets

FOREIGN PATENT DOCUMENTS

| | | |
|---|---|---|
| EP | 930508 | 7/1999 |
| EP | 1 037 056 | 9/2000 |
| JP | 48-32857 | 10/1973 |
| JP | 6-176930 | 6/1994 |
| JP | 6-281712 | 10/1994 |
| JP | 6-347489 | 12/1994 |
| JP | 8-75835 | 3/1996 |
| JP | 10-232259 | 9/1998 |
| JP | 2002-6014 | 1/2002 |

OTHER PUBLICATIONS

Inada et al.; "Quick response large current sensor using amorphous MI element resonant multivibrator"; IEEE Trans. on Mag. vol. 30, No. 6; Nov. 1994; pp. 4623-4625.

* cited by examiner

OVERLOAD CURRENT PROTECTION DEVICE USING MAGNETIC IMPEDANCE ELEMENT

TECHNICAL FIELD

The present invention relates to an overload current protection device for detecting a current flowing through a conductor, and cutting off the current when the current exceeds a predetermined threshold, for example, an overload current protection device capable of controlling the supply of power to a motor.

BACKGROUND ART

Normally, for example, an overload current protection device of this type detects that the current flowing to a 3-phase motor through a contactor exceeds a safe threshold, and cuts off the current to the motor depending on the detection result, which has been realized by making all or a part the current of the motor flow through a bimetallic element. That is, if a current is applied to the switch made of a bimetal, the bimetal is heated depending on the current magnitude, and the motor current exceeds a safe threshold for a predetermined time, then the bimetal is bent by heat and a switch connection point is set in an OFF state, and the current supply to the control input of the contactor is stopped. However, in the system using the switch, it is difficult to adjust a current when the switch enters the OFF state, and there arises the problem that the system is in the misarrangement state for a long time.

To solve the above-mentioned problem, it has been possible to electronically perform the functions which have conventionally been realized by a bimetallic switch. A reliable and easily adjusted device can be provided using electronic equipment. However, since this electronic system requires a complicated circuit, and a number of parts such as a constant voltage power source, etc. are required to operate a contact system by appropriately detecting a current. Furthermore, a current detection transformer (what is called a CT) is used as current detection unit, which causes the problem that a wide current detection range cannot be obtained because the iron core generates magnetic saturation. There also is a method of using a magnetoresistive element. However, since it has low sensitivity, it requires an iron core, thereby failing in obtaining a wide current detection range as in the case of the above-mentioned CT. Additionally, since the magnetoresistive element has a large fluctuation depending on the temperature and a large difference among the elements, and is subject to an influence of disturbance noise, there occurs the problem that high-precision device means requires a high cost.

Therefore, the present invention aims at providing a low-cost and high-precision overload current protection device capable of expanding a current detection range without a constant voltage power source, etc., and without degradation in precision by an environmental characteristic such as disturbance noise, etc. and a change with time.

DISCLOSURE OF INVENTION

To solve the above-mentioned problems, in the invention according to claim 1, an overload current protection device includes: a switch for supplying or cutting off a current from a power source to a load; a current detector for detecting the current; and a control power source which has a power supply transformer including primary winding and secondary winding, is inserted in the current supply line from a power source to a load, and applies power to each unit so that supply of a current to a load can be cut off when an overcurrent occurs. With the configuration, the current detector is configured by a magnetic detection element having a magnetic impedance effect, and is located in a position in which magnetic flux generated by a current flowing through the secondary winding of the power supply transformer can be detected.

In the invention according to claim 2, an overload current protection device includes: a switch for supplying or cutting off a multiphase current from a power source to a load; a current detector for detecting the multiphase current for each phase; and a control power source which has a power supply transformer including primary winding and secondary winding, is inserted in the current supply line from a power source to a load, and applies power to each unit so that supply of a current to a load can be cut off when an overcurrent occurs. With the configuration, each of a plurality of current detectors is configured by a magnetic detection element having a magnetic impedance effect, and is located in a position in which magnetic flux generated by a current flowing through the secondary winding can be detected.

In the invention according to claim 1 or 2, the control power source is configured such that the primary winding and the secondary winding of the power supply transformer are hollow, and includes a capacitor for storing a current of the secondary winding, and a voltage adjuster (invention according to claim 3).

In any of the inventions according to claim 1 through 3, wiring for leading the current and a substrate for fixing the wiring can be provided, wherein the magnetic detection element is arranged near the wiring on the substrate so that the magnetic flux generated by a current can be detected by a magnetic detection element (invention according to claim 4). In any of the inventions according to claim 1 through 4, two magnetic detection elements are arranged in the positions in which the absolute values of the output in response to the magnetic flux generated by a current can be equal and the polarity can be opposite to each other, and the current can be detected from the calculation result of the difference between the outputs of the two magnetic detection elements (invention according to claim 5).

BEST MODE FOR CARRYING OUT THE INVENTION

Figure 1:
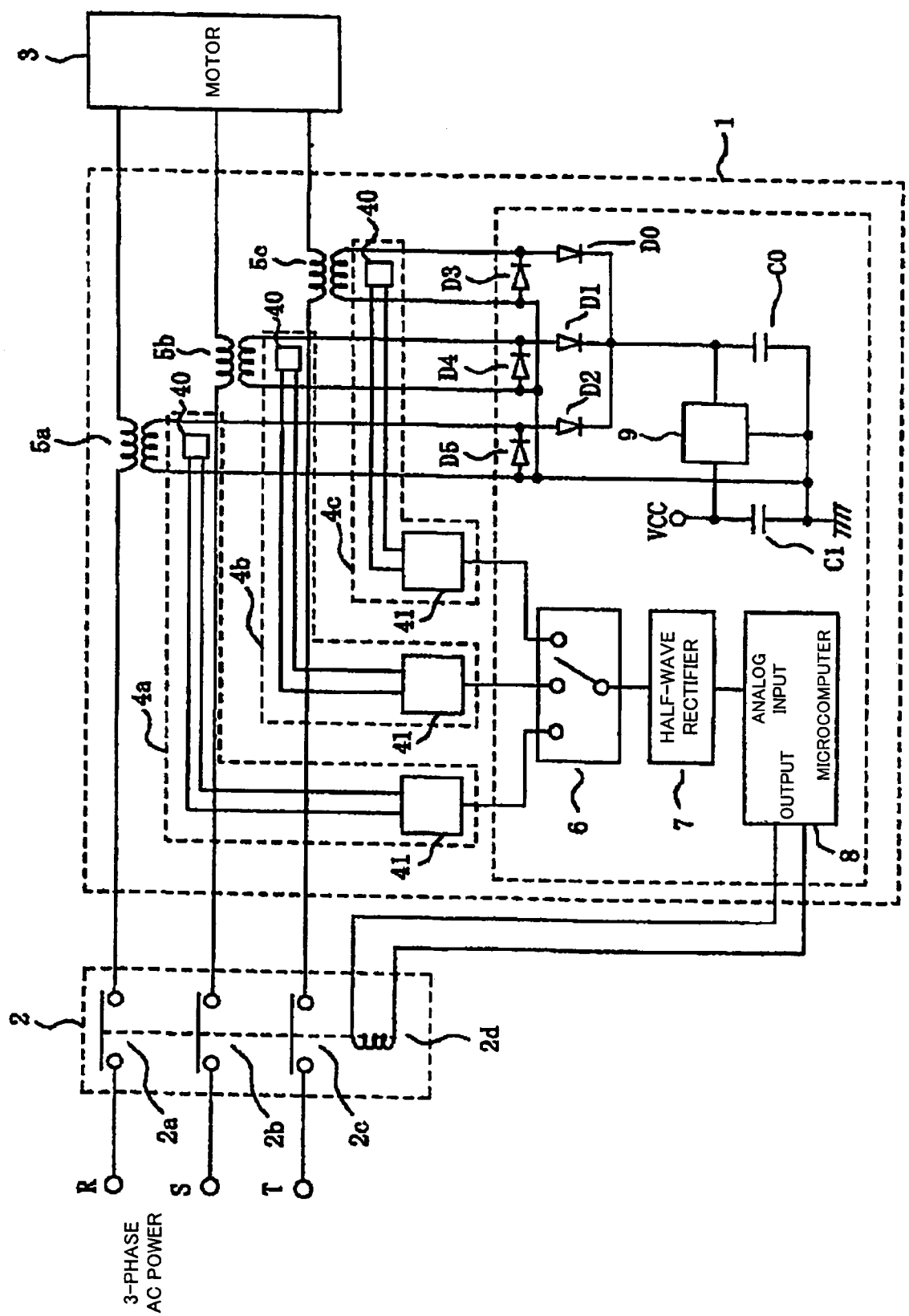
FIG. 1 shows the configuration according to the first embodiment of the present invention.

FIG. 1 shows the entire configuration of the system showing an embodiment of the present invention.

Reference characters R, S, and T denote power supply lines connected to a 3-phase AC power source not shown in the attached drawings, and are connected to a motor 3, which is a load, through a 3-phase contactor (switch) 2 and three power supply transformers 5a, 5b, and 5c. Current detectors 4a, 4b, and 4c are arranged for each phase near the secondary winding of these power supply transformers 5a, 5b, and 5c so that a current flowing through the secondary winding can be detected.

The contactor 2 includes contact points 2a, 2b, and 2c each of which is coupled to the motor 3 through the primary winding of respective power supply transformers 5a, 5b, and 5c by the different power supply lines. The contact points 2a, 2b, and 2c are mechanically coupled for simultaneous operation by an electromagnetic coil 2d. The electromagnetic coil 2d is connected to the end of the digital output of a microcomputer 8. A control circuit including the microcomputer 8, the current detectors 4a, 4b, and 4c, the power supply transformers 5a, 5b, and 5c, etc. form an electronic overload relay 1. The output of the current detectors 4a, 4b, and 4c is sequentially switched through a switch 6. The output of the current detectors 4a, 4b, and 4c selected by the switch 6 is connected to the analog input of the microcomputer 8 through a half-wave rectifier 7.

The control power source is connected to a first capacitor C0 through rectifier diodes D0, D1, and D2 from the secondary winding of the power supply transformers 5a, 5b, and 5c, and is then formed. The first capacitor C0 is connected between the positive input of a voltage adjuster 9 and the ground, and a second (stabilizing) capacitor C1 is connected between the positive output of the voltage adjuster 9 and the ground so that a voltage Vcc at a constant level can be provided as a control power source from the voltage adjuster 9. Protective diodes D3, D4, and D5 are connected between the rectifier diodes D0, D1, and D2.

The practical configuration of the current detectors 4a, 4b, and 4c is described below by referring to FIG. 2. Since the configurations of the current detectors 4a, 4b, and 4c are the same, one of them is described below as a representative configuration.

Figure 2:
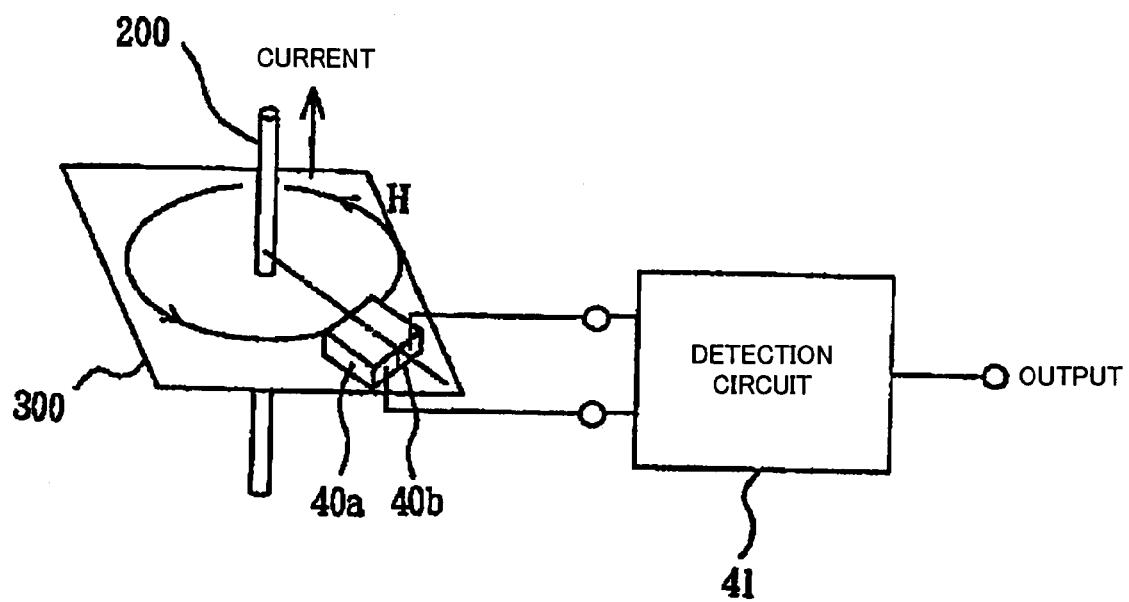
FIG. 2 shows the configuration of an example of the current detector shown in FIG. 1.

As shown in FIG. 2, the current detector is configured by MI elements 40a and 40b having a magnetic impedance (MI) effect, wiring 200 for leading a current, a substrate 300 for fixing the wiring 200 and the MI elements 40a and 40b, and a detection circuit 41.

The MI elements 40a and 40b can be, for example, amorphous wires as disclosed by Japanese Patent Application Laid-open No. Hei 6-281712, or thin film as disclosed by Japanese Patent Application Laid-open No. Hei 8-330645.

Figure 3:
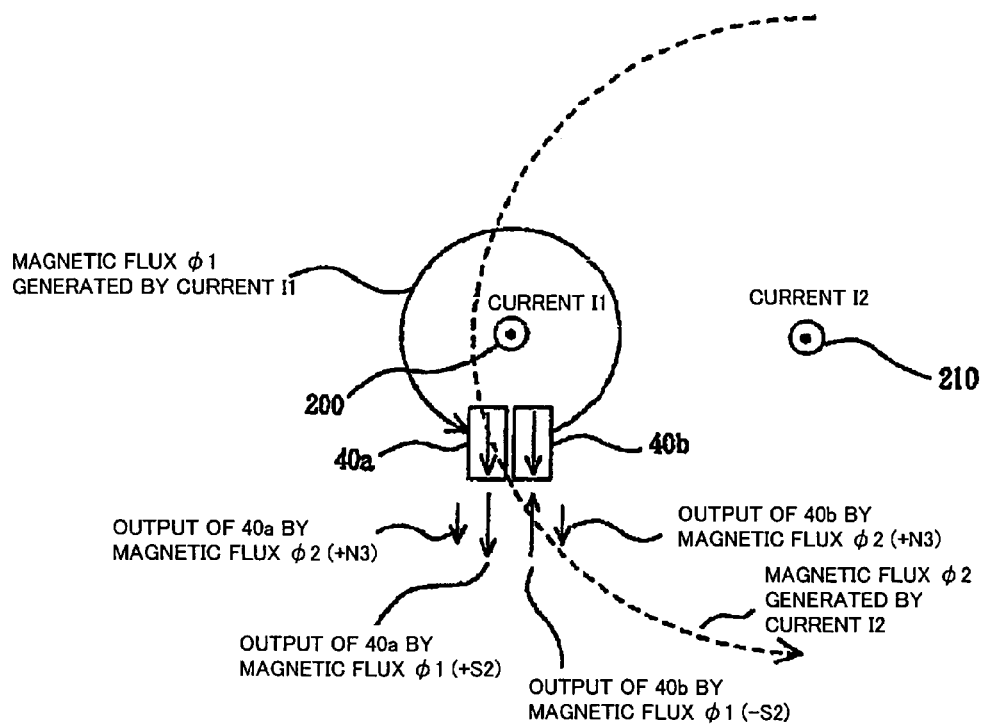
FIG. 3 is an explanatory view showing the influence of the current flowing through adjacent wiring in a current detection element unit.

FIG. 3 shows an example of the case in which currents I1 and I2 flow side by side.

In FIG. 3, assuming that the magnetic flux generated by the currents I1 and I2 are represented by φ1 and φ2 respectively, and the output levels appearing on the two MI elements 40a and 40b by φ1 and φ2 are S2 and N2 respectively, the output of the difference between the two MI elements 40a and 40b is calculated as follows.

$$\text{differential output} = \text{output of } 40a - \text{output of } 40b \qquad (1)$$
$$= S2 + N3 - (-S2 + N3)$$
$$= 2 \times S2$$

thus enabling the detection of the current I1 without the influence of the current I2 of adjacent wiring 210.

Furthermore, when a uniform external magnetic field is applied as noise, the output of equal size and sign appears on the two MI elements 40a and 40b. Therefore, the influence of the external magnetic field can be canceled as in the case of the adjacent wiring.

Figure 4:
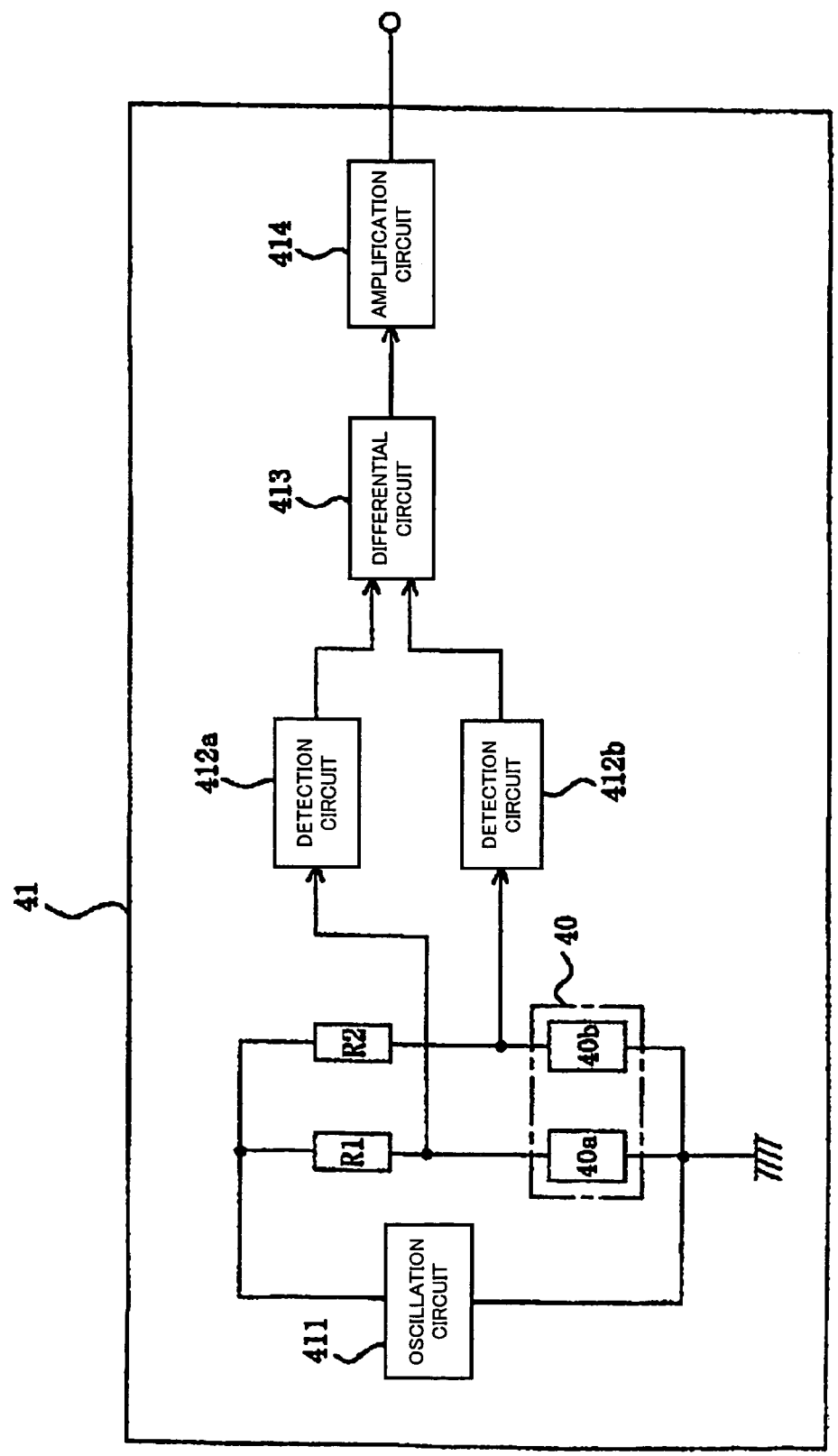
FIG. 4 is a block diagram showing a practical example of the detection circuit.

FIG. 4 shows an example of a detection circuit.

The detection circuit 41 applies a high frequency current to the MI elements 40a and 40b using an oscillation circuit 411, and the partial pressure resistors R3 and R4, detects a change in impedance by the magnetic field of the MI elements 40a and 40b as a change in voltage using detection circuits 412a and 412b, generates the output proportional to the difference between the MI elements 40a and 40b using a differential circuit 413, and retrieves the output using an amplification circuit 414. The differential circuit 413 can be replaced with an addition circuit, and the output proportional to the difference between the MI elements 40a and 40b can be replaced with the output proportional to the sum of the MI elements 40a and 40b.

In the above-mentioned example, the magnetic field detection directions are the same between the two MI elements. However, it is obvious that a current can be detected without the influence of the disturbance noise as in the above-mentioned example by obtaining a sum of the output of the two MI elements with the magnetic field detection directions set opposite each other.

The 3-phase alternating current is applied in the above-mentioned example. However, it is obvious that the single-phase alternating current can also be appropriately used by considering that it corresponds to one phase of the 3-phase alternating current.

Figure 5:
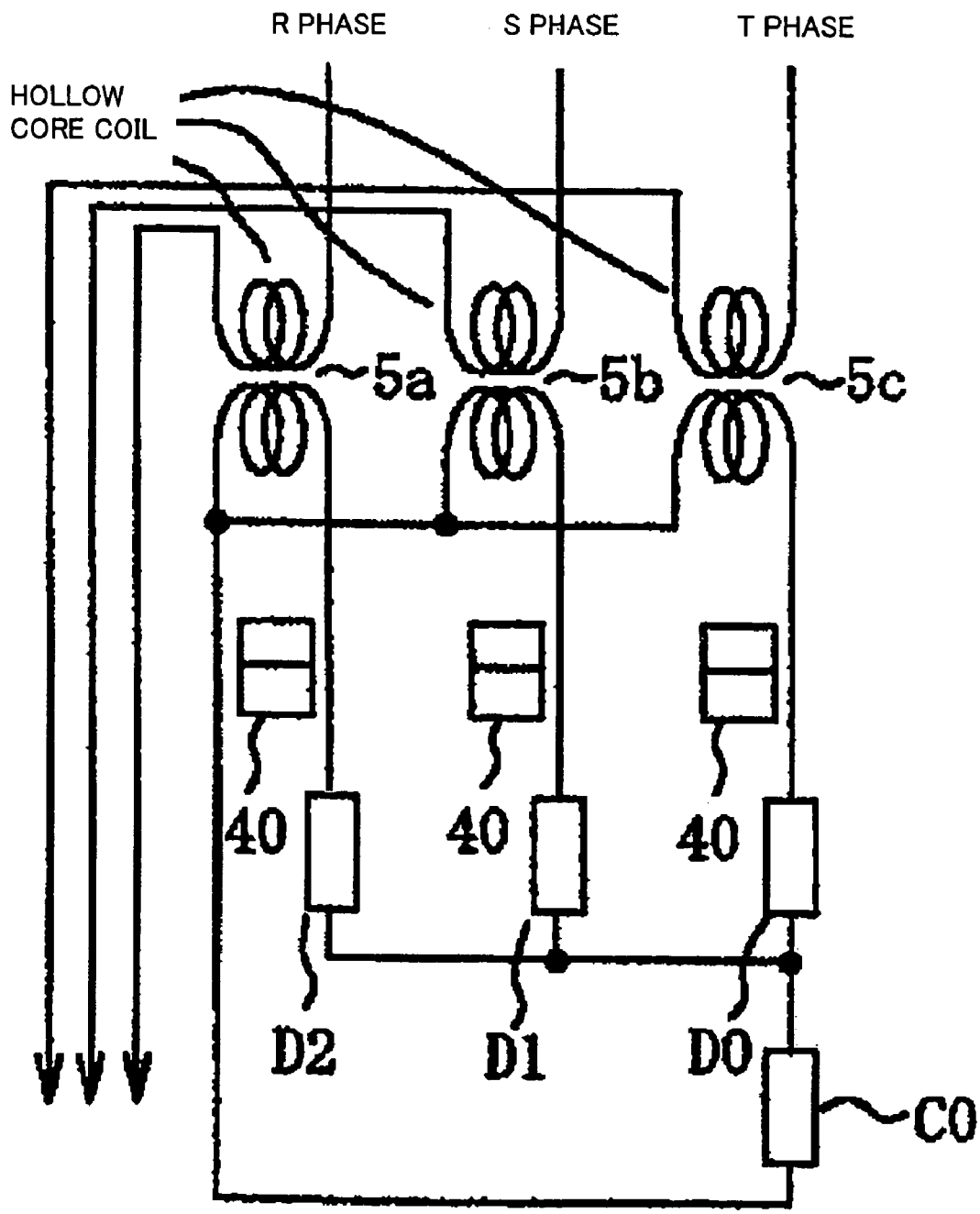
FIG. 5 shows the configuration of a practical example of the control power source shown in FIG. 1.

FIG. 5 shows another example of the control power source.

In FIG. 1, it is assumed that the power supply transformer is configured by an iron core. In the example shown in FIG. 5, a hollow core is used. Since other points are the same as the example shown in FIG. 1, the explanation is omitted here.

INDUSTRIAL APPLICABILITY

According to the present invention, since the magnetic flux generated by a current is detected by a magnetic detection element having a magnetic impedance effect, the magnetic saturation by an iron core caused by a widely used current tolerance does not occur, thereby providing a overload current protection device having a wide current detection range.

Since, in the current detection unit of the present invention, two magnetic detection elements are arranged such that the absolute value of the output of the magnetic detection elements can be the same as the value of the magnetic flux generated by the current and the polarity of the output of the magnetic detection element can be opposite each other, and the difference between the output of the magnetic detection elements is detected, a current can be detected without the influence of the magnetic field by an external magnetic field and a current flowing through the adjacent wiring. Therefore, an overload current protection device which is not easily subject to the influence of noise and excellent in environmental resistance can be provided.

The current detection unit according to the present invention detects a current on the secondary side of the power supply transformer. Therefore, the output sensitivity can be adjusted using high sensitivity magnetic detection element. Especially when a detected current is strong, an overload current protection device having a wide current detection range without output saturation by a detected current can be provided.

Furthermore, the control power source according to the present invention does not require a supply of an external constant voltage power source, thereby providing a general-purpose overload current protection device capable of reducing a total cost.

Additionally, the hollow configuration of the power supply transformer of the control power source of the invention has realized a low cost overload current protection device.

The invention claimed is:

1. An overload current protection device having: a switch for supplying or cutting off a current from a power source to a load; a current detector for detecting the current; and a control power source which has a power supply transformer including primary winding and secondary winding, is inserted in a current supply line from a power source to a load, and applies power to each unit so that supply of a current to a load can be cut off when an overcurrent occurs, characterized in that
    the current detector is configured by a magnetic detection element having a magnetic impedance effect, and is located in a position in which magnetic flux generated by a current flowing through the secondary winding of the power supply transformer can be detected.

2. An overload current protection device having: a switch for supplying or cutting off a multiphase current from a power source to a load; a current detector for detecting the multiphase current for each phase; and a control power source which has a power supply transformer including primary winding and secondary winding, is inserted in a current supply line from a power source to a load, and applies power to each unit so that supply of a current to a load can be cut off when an overcurrent occurs, characterized in that
    each of a plurality of current detectors is configured by a magnetic detection element having a magnetic impedance effect, and is located in a position in which magnetic flux generated by a current flowing through the secondary winding can be detected.

3. An overload current protection device having: a switch for supplying or cutting off a current from a power source to a load: a current detector for detecting the current: and a control power source which has a power supply transformer including primary winding and secondary winding, is inserted in a current supply line from a power source to a load, and applies power to each unit so that supply of a current to a load can be cut off when an overcurrent occurs, characterized in that
    the current detector is configured by a magnetic detection element having a magnetic impedance effect, and is located in a position in which magnetic flux generated by a current flowing through the secondary winding of the power supply transformer can be detected; and
    the control power source is configured such that the primary winding and the secondary winding of the power supply transformer are hollow, and comprises a capacitor for storing a current of the secondary winding, and a voltage adjuster.

4. The device according to either claim 1 or claim 2, characterized in that
    wiring for leading the current and a substrate for fixing the wiring can be provided, the magnetic detection element is arranged near the wiring on the substrate so that the magnetic flux generated by a current can be detected by a magnetic detection element.

5. An overload current protection device having: a switch for supplying or cutting off a current from a power source to a load; a current detector for detecting the current; and a control power source which has a power supply transformer including primary winding and secondary winding, is inserted in a current supply line from a power source to a load, and applies power to each unit so that supply of a current to a load can be cut off when an overcurrent occurs, characterized in that
    the current detector is configured by a magnetic detection element having a magnetic impedance effect, and is located in a position in which magnetic flux generated by a current flowing through the secondary winding of the power supply transformer can be detected; and
    two magnetic detection elements are arranged in the positions in which the absolute values of the output in response to the magnetic flux generated by a current can be equal and the polarity can be opposite to each other, and the current can be detected from the calculation result of the difference between the outputs of the two magnetic detection elements.

6. The device according to claim 3, characterized in that wiring for leading the current and a substrate for fixing the wiring can be provided, the magnetic detection element is arranged near the wiring on the substrate so that the magnetic flux generated by a current can be detected by a magnetic detection element.

7. The device according to claim 3, characterized in that two magnetic detection elements are arranged in the positions in which the absolute values of the output in response to the magnetic flux generated by a current can be equal and the polarity can be opposite to each other, and the current can be detected from the calculation result of the difference between the outputs of the two magnetic detection elements.

8. The device according to claim 4, characterized in that two magnetic detection elements are arranged in the positions in which the absolute values of the output in response to the magnetic flux generated by a current can be equal and the polarity can be opposite to each other, and the current can be detected from the calculation result of the difference between the outputs of the two magnetic detection elements.

9. An overload current protection device having: a switch for supplying or cutting off a multiphase current from a power source to a load; a current detector for detecting the multiphase current for each phase; and a control power source which has a power supply transformer including primary winding and secondary winding, is inserted in a current supply line from a power source to a load, and applies power to each unit so that supply of a current to a load can be cut off when an overcurrent occurs, characterized in that
    each of a plurality of current detectors is configured by a magnetic detection element having a magnetic impedance effect, and is located in a position in which magnetic flux generated by a current flowing through the secondary winding can be detected; and
    the control power source is configured such that the primary winding and the secondary winding of the power supply transformer are hollow, and comprises a capacitor for storing a current of the secondary winding, and a voltage adjuster.

10. An overload current protection device having: a switch for supplying or cutting off a multiphase current from a power source to a load; a current detector for detecting the multiphase current for each phase; and a control power source which has a power supply transformer including primary winding and secondary winding, is inserted in a current supply line from a power source to a load, and applies power to each unit so that supply of a current to a load can be cut off when an overcurrent occurs, characterized in that each of a plurality of current detectors is configured by a magnetic detection element having a magnetic impedance effect, and is located in a position in which magnetic flux generated by a current flowing through the secondary winding can be detected; and two magnetic detection elements are arranged in the positions in which the absolute values of the output in response to the magnetic flux generated by a current can be equal and the polarity can be opposite to each other, and the current can be detected from the calculation result of the difference between the outputs of the two magnetic detection elements.

11. The device according to claim 9, characterized in that wiring for leading the current and a substrate for fixing the wiring can be provided, the magnetic detection element is arranged near the wiring on the substrate so that the magnetic flux generated by a current can be detected by a magnetic detection element.

12. The device according to claim 9, characterized in that two magnetic detection elements are arranged in the positions in which the absolute values of the output in response to the magnetic flux generated by a current can be equal and the polarity can be opposite to each other, and the current can be detected from the calculation result of the difference between the outputs of the two magnetic detection elements.

* * * * *